United States Patent [19]
Han

[11] Patent Number: 5,481,498
[45] Date of Patent: Jan. 2, 1996

[54] REDUNDANCY CIRCUIT FOR SEMICONDUCTOR MEMORY DEVICE

[75] Inventor: Seok Woo Han, Kyungki-do, Rep. of Korea

[73] Assignee: Goldstar Electron Co., Ltd., Cheongju, Rep. of Korea

[21] Appl. No.: 320,341

[22] Filed: Oct. 11, 1994

Related U.S. Application Data

[62] Division of Ser. No. 911,611, Jul. 10, 1992, Pat. No. 5,355,338.

[30] Foreign Application Priority Data

Jul. 11, 1991 [KR] Rep. of Korea ............ 91-12072

[51] Int. Cl.⁶ .................... G11C 7/00; G11C 29/00
[52] U.S. Cl. ............ 365/185.09; 365/185; 365/189.09; 365/226; 365/185.23; 365/185.2
[58] Field of Search .................... 365/200, 900, 365/185, 218, 189.09, 226; 371/10.2–10.3

[56] References Cited

U.S. PATENT DOCUMENTS

| | | | |
|---|---|---|---|
| 4,794,568 | 12/1988 | Lim et al. | 365/200 |
| 5,233,566 | 8/1993 | Imamiya et al. | 365/200 X |

*Primary Examiner*—Do Hyun Yoo
*Attorney, Agent, or Firm*—Alan R. Loudermilk

[57] ABSTRACT

A memory redundancy circuit using FLOTOX transistors instead of conventional link fuses and thus capable of redundancy programming even after the packaging of the chip. The redundancy circuit is capable of generating spare signals in order to use spare memory cells for particular addresses. The circuit includes: a reference line having a certain voltage level for generating spare signals; a reference voltage supplying circuit for supplying the required voltage to the reference line; two or more FLOTOX transistors connected to the reference line; and high voltage driving circuits provided for the FLOTOX transistors, and connected to address lines in such a manner as to supply the required voltage to the gates of the FLOTOX transistors for programming.

17 Claims, 3 Drawing Sheets

REDUNDANCY CIRCUIT FOR SEMICONDUCTOR MEMORY DEVICE

This is a divisional of application Ser. No. 07/911,611 filed on Jul. 10, 1992, now U.S. Pat. No. 5,355,338.

FIELD OF THE INVENTION

The present invention relates to a redundancy circuit for semiconductor memory devices, and more particularly to a redundancy circuit in which programming can be made in such a manner as to make the redundancy memory operable for a particular address even after packaging of the chip such as by using "FLOTOX" transistors, and in which a particular programmed address can be erased and modified.

BACKGROUND OF THE INVENTION

In conventional semiconductor memories, programming is made in such a manner that, if there happens to be formed a defect in the memory cell of a particular address, a redundancy memory is used for that particular address by utilizing link fuses. The use of link fuses, however, can cause various problems.

FIG. 1 illustrates a conventional redundancy circuit, and FIG. 2 illustrates the constitution and operating principle of a link fuse. In a conventional redundancy circuit as shown in FIG. 1, spare rows and columns are used instead of the addresses of defective memory cells in the manner as described below. That is, the link fuses, which are connected to the drains of transistors so as to correspond to the defective addresses, are burned using a laser repair apparatus or by allowing an electrical overcurrent to flow through them, thereby cutting the fuses.

As shown in FIG. 2(A), the link fuse is constituted such that the following layers are formed upon silicon substrate Si-Sub in the indicated order: a thick oxide layer Fox, a polysilicon 2 or polycide layer, an LTO (low temperature oxidation) layer, and a PSG (phosphorus silicate glass) or BPSG (boron psg) layer.

FIG. 2(A) illustrates the structure before the programming, i.e., before the burning, and FIG. 2(B) illustrates the structure after the programming, i.e., after the burning.

Dotted line W of FIG. 2(B) illustrates a case in which the fuse link is not cut off due to insufficiency of the intensity of the laser beam or positional inaccuracy of the laser apparatus, on the one hand, and dotted line U illustrates a case in which silicon substrate Si-Sub is damaged due to excessive burning, on the other hand.

The conventional redundancy circuit of a semiconductor memory using address suppression will be described below with reference to FIG. 1.

A signal $\overline{SPAREENB}$ stays in a "0" state during operation. When the programming has not been performed, one of the two transistors of each transistor pair, which are connected respectively to the pairs of $A_0$ and $\overline{A_0}$, $A_1$ and $\overline{A_1}$, ... $A_n$ and $\overline{A_n}$, remains in a turned-on state. That is, n+1 transistors among the 2(n+1) transistors, which includes all of the transistors with fuse links connected thereto, are always in a turned-on state, so that the voltage on line B stays at a "0" level.

In such a circuit constituted as described above, the method of programming so that a particular defective address, e.g., addresses "$A_0, A_1, \ldots A_n$", corresponding to "0, 1, ... 1", is replaced with the redundancy circuit of FIG. 1, is carried out in the manner described below. That is, programming is carried out by burning link fuses which are connected, respectively, to the drains of NMOS transistors, which are in turn connected, respectively, to addresses $\overline{A_0}, A_1, \ldots A_n$.

If the programming is carried out in the above described manner, the voltage on line B is shifted to a "1" state only when the addresses correspond, for example, to "0, 1, ... 1", while the voltage on line B stays in a "0" state otherwise. The main decoder connected to the original memory cell array is not operated in a "1" state of the spare signal on line B, but is operated in a "0" state of the spare signal on line B. If the spare signal on line B is shifted to a "1" state, the spare rows and columns are activated so that the spare rows and columns are able to store and output signals instead of the original rows and columns.

In the above described conventional redundancy circuit, in order to cut off the link fuses, a special laser repair apparatus or high current circuit is required. In procuring, maintaining and using the apparatus or circuit, higher costs are incurred, and further, frequent failures occur in cutting off the link fuses due to positional inaccuracy or variation of the uniformness of the intensity of the laser beam, with the result that defects are formed in the memory devices. Further, if the cutting power is too high, leakage current flows from the link fuse to the silicon substrate, or debris from the burnt fuse flies to other portions of the circuit, thereby forming defects in the memory devices.

SUMMARY OF THE INVENTION

The present invention is intended to overcome the above described disadvantages of conventional techniques.

Therefore it is an object of the present invention to provide a memory redundancy circuit in which a FLOTOX (floating-gate tunneling oxide) transistor is used to program the activation of the redundancy memory cell and not a link fuse, so that defective addresses can be programmed even with the chip packaged.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
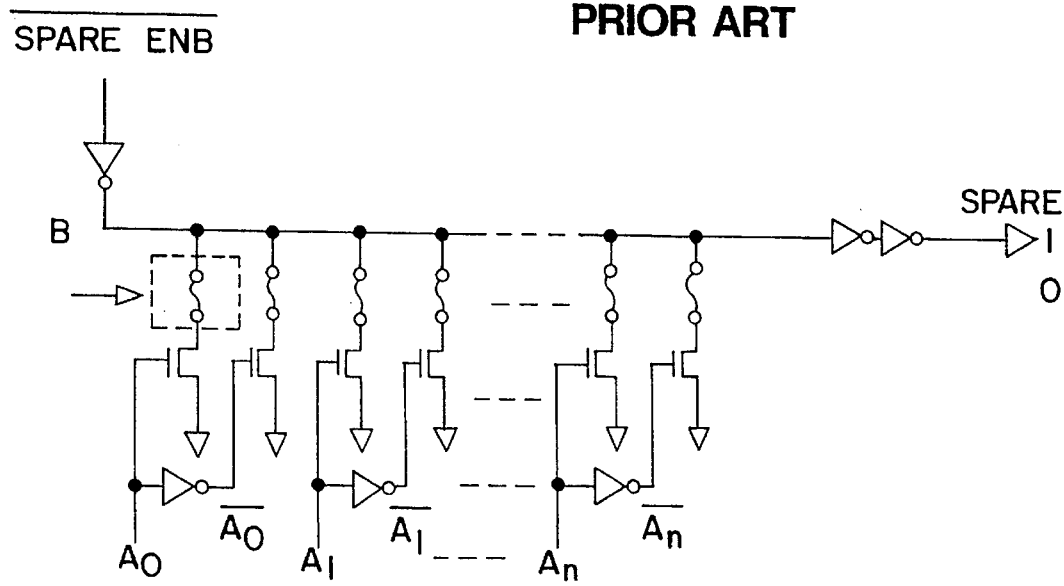
FIG. 1 illustrates a conventional redundancy circuit.
Figure 2A:
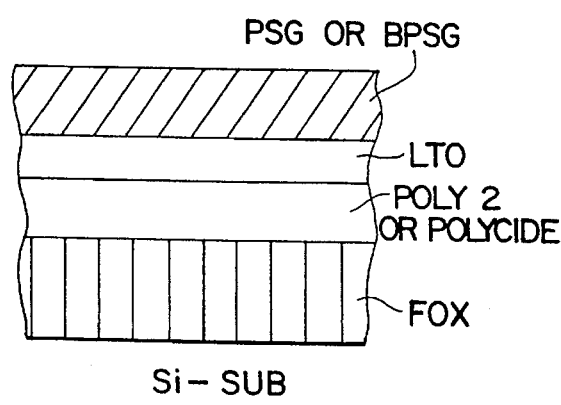
FIGS. 2A and 2B illustrate the constitution and programmed state of a link fuse used in conventional redundancy circuits, one of which is indicated by the arrow of FIG. 1.
Figure 2B:
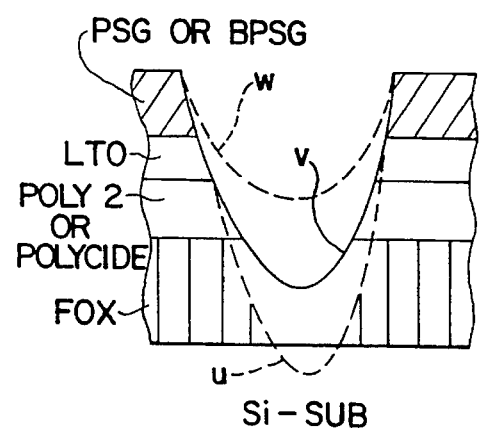
Figure 3:
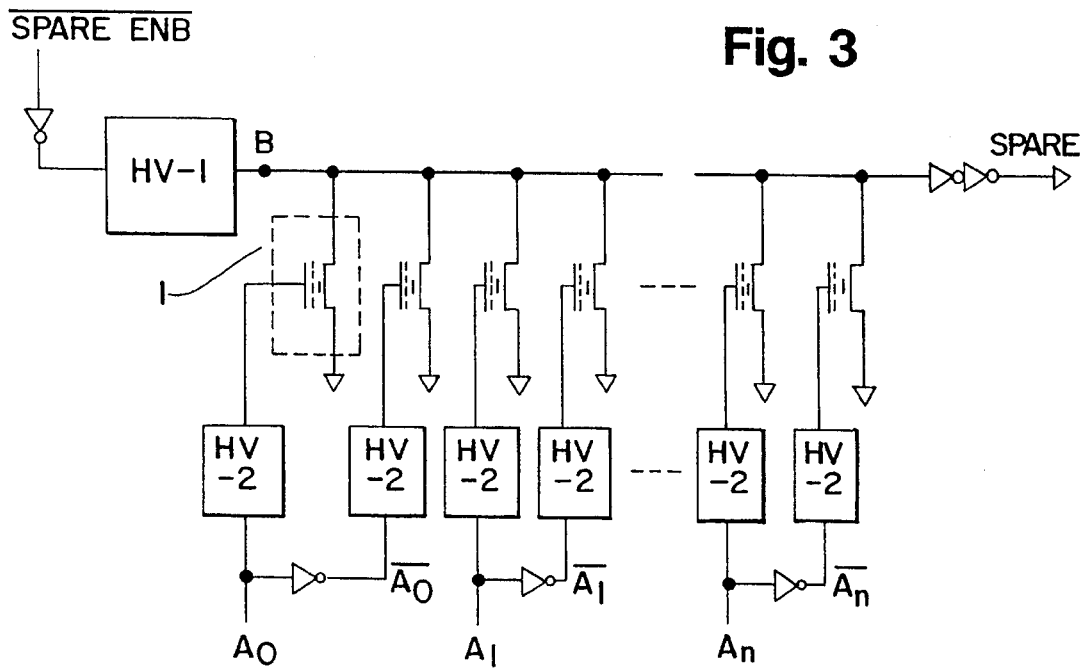
FIG. 3 illustrates the redundancy circuit according to the present invention.

The present invention provides a redundancy circuit using FLOTOX transistors (a kind of EEPROM cell) instead of burning link fuses, and the preferred embodiment of this circuit is illustrated in FIG. 3. A difference between the circuits of FIGS. 1 and 3 is that FLOTOX transistors are used in FIG. 3 and not the fuse links and NMOS transistors of FIG. 1. In order to program the FLOTOX transistors and to erase them by means of high voltage signals, the driving circuits of FIGS. 4 and 5 also are provided.

Figure 6A:
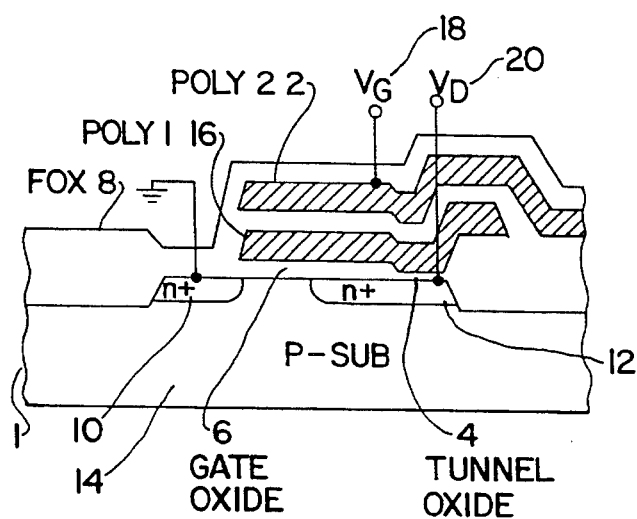
FIGS. 6A and FIG. 6B illustrate the structure of the FLOTOX transistor, and its equivalent circuit, used in the redundancy circuit of the present invention.
Figure 6B:
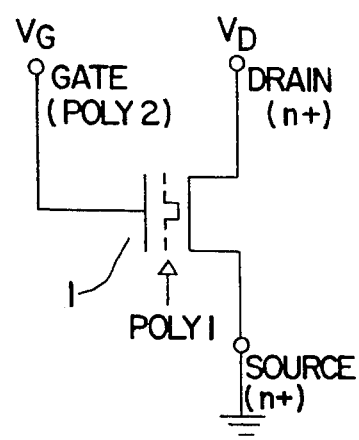

FIG. 6 illustrates the structure of FLOTOX transistor 1. Prior to programming FLOTOX transistor 1, floating gate 16, which in the preferred embodiment is a first layer of polysilicon, has no electrons trapped thereon. Therefore, transistor 1 is turned on when $V_G$=Vcc is applied to gate 2, which in the preferred embodiment is a second layer of polysilicon, owing to the formation of a channel between drain 12 and source 10 of transistor 1. During programming, voltages $V_G$=Vpp and $V_D$=Vpp (Vpp>Vcc) are supplied to gate 2 and drain 12, respectively. As a result, electrons flow from drain 12 through thin or "tunnel" oxide layer 4 (lying under floating gate 16) to floating gate 16 owing to the tunneling effect, so that electrons are trapped on floating gate 16. After the completion of programming, even if a $V_G$=Vcc voltage is supplied to gate 2, no channel is formed between drain 12 and source 10, with the result that FLOTOX transistor 1 is not turned on.

If the electrons trapped on floating gate 16 are to be released, that is, if an erasing operation is to be performed, voltages $V_G$=0 and $V_D$=Vpp are supplied to gate 2 and drain 12, respectively. As a result, electrons trapped on floating gate 16 are discharged through drain 12 to $V_D$ terminal 20. Thus, after completion of the erasing operation, FLOTOX transistor 1 returns to the initial state as before programming, and, in this state, if a voltage $V_G$=Vcc is supplied to gate 2, a channel is formed between drain 12 and source 10 of transistor 1, so that FLOTOX transistor 1 is turned on. By adjusting the external signals $V_G$ and $V_D$, the programming-erasing process can be repeatedly carried out for FLOTOX transistor 1. A current cannot flow through programmed FLOTOX transistor 1 when a voltage $V_G$=Vcc is supplied to gate 2, analogous to the case of cutting-off a link fuse.

Figure 4:
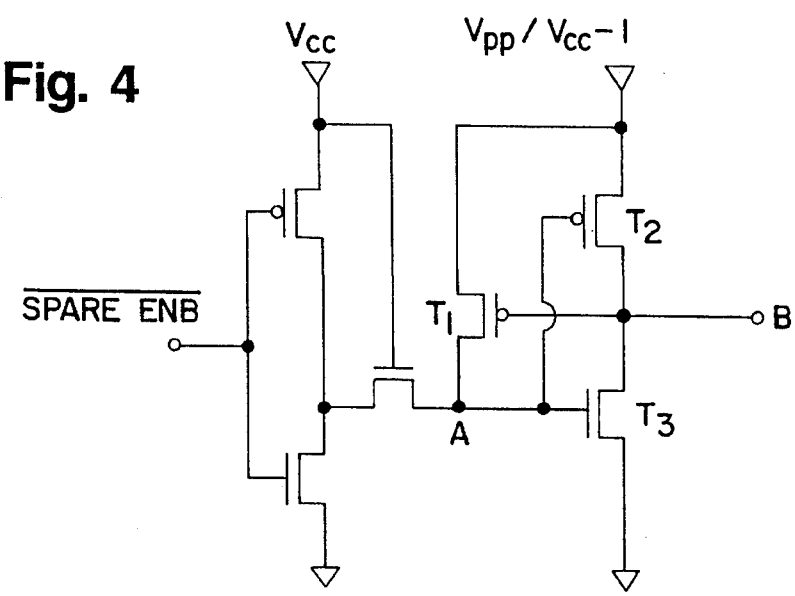
FIG. 4 illustrates circuit HV-1 of the redundancy circuit of FIG. 3.

FIG. 4 illustrates reference voltage supplying circuit HV-1. Reference voltage supplying circuit HV-1 includes: a Vcc inverter section consisting of two NMOS transistors and a PMOS transistor; and a Vpp/Vcc-1 inverter section consisting of PMOS FET transistors $T_1$ and $T_2$ and NMOS FET transistor $T_3$.

The operation of circuit HV-1 is carried out in such a manner that voltage Vcc is supplied to the Vcc terminal, and a voltage Vpp is supplied to the Vpp/Vcc-1 terminal. Thus, when signal $\overline{SPAREENB}$ is in a high state, node "a" is kept in a low state, and thus transistor $T_3$ is turned off, with transistor $T_2$ being turned on so that the voltage of line "B" should be Vpp. On the other hand, when signal $\overline{SPAREENB}$ is in a low state, although node "a" is at voltage Vcc, transistor $T_3$ is turned on so as for line "B" to have a "0" state, while transistor $T_1$ also is turned on so that node "a" is shifted from Vcc to Vpp.

Further, if a voltage Vcc is supplied to the Vcc terminal, and if a voltage Vcc also is supplied to the Vpp/Vcc-1 terminal, then the two inverters are connected in series. Consequently, if signal $\overline{SPAREENB}$ is high, line "B" is kept at a Vcc level, while, if signal $\overline{SPAREENB}$ is low, line "B" is shifted to a "0" state.

Figure 5:
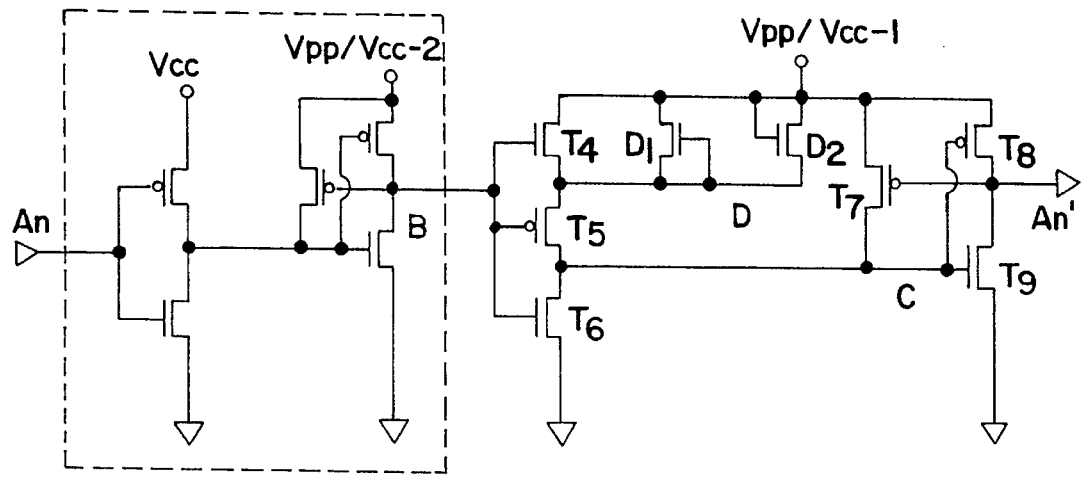
FIG. 5 illustrates circuit HV-2 of the redundancy circuit of FIG. 3.

FIG. 5 illustrates high voltage driving circuit HV-2. The circuit portion that is indicated by the dotted lines is the same as circuit HV-1 in its constitution and operation, while the rest of the circuit consists of two inverters connected in series. Transistors $T_4$, $T_5$, $T_6$, $D_1$, and $D_2$ constitute one of the two inverters, while transistors $T_7$, $T_8$, and $T_9$ constitute the other of the two inverters.

Circuit HV-2 constituted as above will now be described as to its operations.

A voltage Vcc is supplied to the Vcc terminal, and a voltage Vpp or Vcc is supplied to the Vpp/Vcc terminals depending on the operating mode.

(A) When a voltage Vpp is supplied to the Vpp/Vcc-1 and Vpp/Vcc-2 terminals, if signal "$A_n$" is high, then line "B" is shifted to Vpp, transistor $T_5$ is turned off, and transistor $T_6$ is turned on, so that node "C" is shifted to "0". Further, transistor $T_8$ is turned on, and transistor $T_9$ is turned off, so that signal "$A_n'$" is shifted to Vpp.

On the other hand, if signal "$A_n$" is low then line "B" is kept in a low state, transistor $T_5$ is turned on, and transistor $T_6$ is turned off, with the result that node "C" is shifted to Vpp, transistor $T_8$ is turned off, and transistor $T_9$ is turned on, thereby shifting signal "$A_n'$" to a "0" state.

(B) When a voltage Vpp is supplied to the Vpp/Vcc-1 terminal, and a voltage Vcc is supplied to the Vpp/Vcc-2 terminal, if signal "$A_n$" is high, then line "B" is shifted to Vcc, and transistor $D_2$ is turned on, so that node "D" is shifted to Vpp. Further, both of transistors $T_5$ and $T_6$ are turned on (because the Vgs value of transistor $T_5$ becomes negative) so as for both transistors to serve as voltage distributors. Under this condition, transistor $T_9$ is turned on, and transistor $T_8$ is turned off, so that signal "$A_n'$" is shifted to a "0" state, and that node "C" is shifted to voltage Vpp upon turning on of transistor $T_7$.

On the other hand, if signal "$A_n$" is low then node "B" is kept in a "0" state, transistor $T_5$ is turned on, and transistor $T_6$ is turned off, so that node "C" is shifted to Vpp, and that signal "$A_n'$" is shifted to a "0" state.

That is, regardless of whether signal "$A_n$" is high or low, signal "$A_n'$" is kept always in a "0" state.

(C) When a voltage Vcc is supplied to both the Vpp/Vcc-1 and Vpp/Vcc-2 terminals, there is formed a serial circuit consisting of four inverters, and therefore, if signal "$A_n$" is high, signal "$A_n'$" becomes a Vcc level, while, if signal "$A_n$" is low, signal "$A_n'$" becomes a "0" state.

Now the redundancy circuit of FIG. 3, which is the preferred embodiment of the present invention, will be described as to its operation.

First in relation to its constitution, signal $\overline{SPAREENB}$ is supplied through an inverter to circuit HV-1, and the output of circuit HV-1 appears on line "B", while the voltage of line "B" is output as a "SPARE" signal.

The drain terminals of FLOTOX transistors in the number of 2(n+1) are connected to line "B", and the source terminals of the 2(n+1) FLOTOX transistors are grounded. Each respective gate of a first group of FLOTOX transistors which are provided in the number of (n+1) are connected to a respective one of terminals $A_0$, $A_1$, ... $A_n$ of the address lines through respective high voltage driving circuits HV-2, and each respective gate of a second group of FLOTOX transistors which are provided in the number of (n+1) are connected to a respective one of terminals $A_0$, $A_1$, ... $A_n$ of the address lines through respective high voltage driving circuits HV-2 and inverters.

That is at line "B" one address line is connected to two FLOTOX transistors in such a manner that one of the gates of the two transistors is connected through an HV-2 circuit to the address line and the other gate of the two transistors is connected through an HV-2 circuit and an inverter to the address line.

Now the operation during programming will be described. If a voltage Vpp is supplied to both of the Vpp/Vcc-1 and Vpp/Vcc-2 terminals, and if a particular address is input to an address line, then a high signal is input into a particular circuit HV-1 when signal $\overline{\text{SPAREENB}}$ is low, while the output of the particular circuit HV-1 has a Vpp level so as for line "B" to have a Vpp level.

In accordance with the particular address which is supplied to the address lines, a voltage Vpp is supplied or not supplied to the gates of the FLOTOX transistors which are connected to the respective address lines. For example, as to terminal "$A_0$", if terminal "$A_0$" has a high state, the output of the respective circuit HV-2 has a Vpp level, with the result that a voltage Vpp is supplied to the gate of the respective FLOTOX transistor. Thus, the particular FLOTOX transistor is programmed and it becomes as if a link fuse has been burned or melted off, in that the FLOTOX transistor will not turn on even if a voltage Vcc is supplied to its gate as a result of the programming.

Further, $\overline{A_0}$ becomes low because of the high state of the terminal $A_0$, and therefore, the FLOTOX transistor coupled to terminal $\overline{A_0}$ is not programmed (remains operable).

In the case where the programmed contents are to be erased, a voltage Vpp is supplied to the Vpp/Vcc-1 terminal, and a voltage Vcc is supplied to the Vpp/Vcc-2 terminal. When signal $\overline{\text{SPAREENB}}$ is low, the output of circuit HV-1 has a Vpp level so as for line "B" to have a Vpp level, while the output of circuit HV-2 has a low state regardless of the state of the address lines, thereby erasing the programmed contents, and restoring the FLOTOX transistors to an operable state.

The operation of the programmed redundancy circuit can be resumed by supplying a voltage Vcc to all of the Vpp/Vcc-1, Vpp/Vcc-2 and Vcc terminals. Under this condition, if signal $\overline{\text{SPAREENB}}$ has a low state, a voltage Vcc is supplied to line "B" and in accordance with the status of the address terminals, that is, if a programmed particular address appears, then the FLOTOX transistor which is connected to the programmed address line is turned off. Consequently, line "B" is kept at a Vcc level, and signal "SPARE" is output with a high level, i.e., with the level of "1", with the result that another cell of a spare memory region is used for the particular address instead of the memory cell of the relevant memory array.

A plurality of such redundancy circuits can be accommodated within a single memory device in rows and columns. If one of the redundancy circuits is used after programming due to the occurrence of a defect for a first defective address in an initial stage, and if another defect is formed and detected thereafter for a second defective address, then the initially programmed redundancy circuit can be erased, and another programming can be made so as to make use of two redundancy circuits for the first and second defective addresses, with further defects being remedied in the same manner as many times as the number of defects.

According to the redundancy circuit of the present invention as described above, not only the disadvantages of the conventional redundancy circuit can be overcome, but it has a spare capability for remedying additionally occurring defects as many times as the number of the defects, thereby improving the reliability of the products.

Although various preferred embodiments of the invention have been disclosed for illustrative purposes, those skilled in the art will appreciate that various modifications, additions and/or substitutions are possible without departing from the scope and spirit of the invention as defined in the accompanying claims.

What is claimed is:

1. A redundancy circuit for generating a spare signal in a memory device having memory cells and spare memory cells, wherein some of the memory cells may be defective and wherein in response to the spare signal one or more space memory cells are addressed in the memory device, comprising:

address lines for receiving addresses corresponding to the memory cells in the memory device, wherein one or more addresses correspond to defective memory cells;

a reference line for generating the spare signal;

a reference voltage circuit coupled to the reference line for supplying a first programming voltage and a spare signal voltage to the reference line;

at least a pair of programmable transistors having an initially unprogrammed state and each having a gate, a source and a drain, the drains and sources of the transistors being coupled to the reference line and ground potential, respectively;

high voltage driving circuits coupled to the gates of the transistors and to one or more address lines, wherein the transistors are programmed in response to the first programming voltage supplied by the reference voltage circuit and a second programming voltage supplied by the high voltage driving circuits, wherein the redundancy circuit produces the spare signal on the reference line in response to an address corresponding to a defective memory cell.

2. The redundancy circuit of claim 1, wherein the transistors comprise FLOTOX transistors.

3. The redundancy circuit of claim 1, wherein the transistors comprise EEPROM cells.

4. The redundancy circuit of claim 1, wherein:

the reference voltage circuit comprises two inverters, wherein the reference voltage circuit outputs a first voltage level signal for generating the spare signal voltage and outputs a second voltage level signal for the first programming voltage for programming the transistors; and the high voltage driving circuit comprises four inverters and outputs a third voltage level signal for generating the spare signal voltage and outputs a fourth voltage level signal for the second programming voltage for programming the transistors.

5. The redundancy circuit of claim 4, wherein:

the reference voltage circuit comprises: a first CMOS inverter coupled to a first voltage terminal, and a second CMOS inverter coupled to a second voltage terminal, and the high voltage driving circuit comprises: a third CMOS inverter coupled to the first voltage terminal, a fourth CMOS inverter coupled to a third voltage terminal, and fifth and sixth CMOS inverters coupled to the second voltage terminal.

6. The redundancy circuit of claim 5, wherein during programming of the transistors a first voltage level signal is supplied to the first voltage terminal, and a second voltage level signal having a voltage level higher than the voltage level of the first voltage level signal and capable of programming the transistors is supplied to the second and third voltage terminals, and wherein during addressing of the memory cells the first voltage level signal is supplied to each of the first, second and third voltage terminals.

7. The redundancy circuit of claim 5, wherein in response to-application of a first voltage level signal to the first voltage terminal, a second voltage level signal to the second voltage terminal, and the first voltage level signal to the third voltage terminal, the transistors are erased to an unprogrammed state.

8. A redundancy circuit for a memory device having memory cells and spare memory cells, wherein some of the memory cells may be defective, comprising:

addressing means for supplying addressing signals for addressing the memory cells;

a spare memory cell selecting line, wherein the spare memory cells are selected in response to a Spare memory selecting signal on the spare memory cell selecting line;

a plurality of programmable and erasable elements coupled to the addressing means and coupled to the spare memory cell selecting line;

a reference voltage circuit for supplying voltages to the selecting line, wherein the reference voltage circuit outputs the spare memory selecting signal of a first voltage level for selecting the spare memory cells and outputs a first programming signal of a second voltage level signal for programming the programmable and erasable elements; and programming means coupled to the programmable and erasable elements and the addressing means for programming the programmable and erasable elements with addresses of defective memory cells and for erasing the programmable and erasable elements, wherein the programming means provides a second programming signal of a third voltage level to the programmable and erasable elements for programming the programmable and erasable elements and provides an erasing signal of a fourth voltage level to the programmable and erasable elements for erasing the programmable and erasable elements;

wherein, the programmable and erasable elements are programmed with the addresses of defective memory cells in response to the first and second programming signals and the address signals, and the programmable and erasable elements are erased in response to the erasing signal, and the spare memory cells are selected in response to the spare memory selecting signal and the address signals.

9. The redundancy circuit of claim 8, wherein the programmable and erasable elements comprise EEPROM cells.

10. The redundancy circuit of claim 8, wherein the programmable and erasable elements comprise FLOTOX transistors.

11. The redundancy circuit of claim 8, wherein the reference voltage circuit comprises two inverter circuits, and the programming means comprises four inverter circuits.

12. The redundancy circuit of claim 11, wherein the reference voltage circuit comprises a first CMOS inverter circuit coupled to a first voltage terminal, and a second CMOS inverter circuit coupled to a second voltage terminal, and the programming means comprises a third CMOS inverter circuit coupled to the first voltage terminal, a fourth CMOS inverter circuit coupled to a third voltage terminal, and fifth and sixth CMOS inverter circuits coupled to the second voltage terminal.

13. The redundancy circuit of claim 12, wherein during programming of the programmable and erasable elements a first voltage level signal is supplied to the first voltage terminal, and a second voltage level signal having a voltage level higher than the voltage level of the first voltage level signal is supplied to the second and third voltage terminals, and wherein during addressing of the memory cells the first voltage level signal is supplied to each of the first, second, and third voltage terminals.

14. The redundancy circuit of claim 12, wherein the programmable and erasable elements are erased to an unprogrammed state in response to application of a first voltage level signal to the first voltage terminal, a second voltage level signal to the second voltage terminal, and the first voltage level signal to the third voltage terminal.

15. In a memory device having memory cells, some of which may be defective, one or more spare memory cells activated in response to a spare memory selection signal on a spare memory selection line, address lines for receiving addresses of the memory cells and the one or more spare memory cells, and programmable and erasable transistors coupled through a high voltage driving circuit to the address lines and the one or more spare memory cells, a method of selecting a spare memory cell, comprising the steps of:

determining the address of a defective memory cell;

applying a first programming signal to the spare memory selection line and applying a second programming signal to the programmable and erasable transistors by the high voltage driving circuit in accordance with the address of the defective memory cell, wherein the programmable and erasable transistors are programmed with the address of the defective memory cell;

applying the spare memory selection signal to the spare memory selection line;

applying to the address lines the address of the defective memory cell; and selecting the spare memory cell by maintaining the spare memory selection signal on the spare memory selection line.

16. The method of claim 15, wherein the programmable and erasable transistors comprise EEPROM cells.

17. The method of claim 15, wherein the programmable and erasable transistors comprise FLOTOX transistors.

* * * * *